United States Patent
Lipshitz et al.

(10) Patent No.: US 8,565,699 B1
(45) Date of Patent: *Oct. 22, 2013

(54) SETTING OF POWER AMPLIFIER CONTROL VOLTAGE

(75) Inventors: David Lipshitz, Ra'anana (IL); Alexander Zaslavsky, Petach Tikva (IL)

(73) Assignee: Marvell International Ltd., Hamilton (BM)

( * ) Notice: Subject to any disclaimer, the term of this patent is extended or adjusted under 35 U.S.C. 154(b) by 23 days.

This patent is subject to a terminal disclaimer.

(21) Appl. No.: 12/772,211

(22) Filed: May 2, 2010

Related U.S. Application Data

(60) Provisional application No. 61/255,812, filed on Oct. 28, 2009, provisional application No. 61/245,235, filed on Sep. 23, 2009.

(51) Int. Cl.
*H01Q 11/12* (2006.01)

(52) U.S. Cl.
USPC .......... 455/127.2; 455/522; 455/523; 455/68; 455/550.1; 455/552.1; 455/570; 455/572; 455/115.1; 455/126; 455/127.1; 330/149; 330/298; 330/96

(58) Field of Classification Search
USPC .......... 455/127.2, 522, 523, 68, 550.1, 552.1, 455/570, 572, 115.1, 126, 127.1; 330/149, 330/298, 96
See application file for complete search history.

(56) References Cited

U.S. PATENT DOCUMENTS

| | | | |
|---|---|---|---|
| 6,236,863 B1 | 5/2001 | Waldroup et al. | |
| 6,498,785 B1 * | 12/2002 | Derryberry et al. | 370/311 |
| 6,735,420 B2 | 5/2004 | Baldwin | |
| 6,788,138 B2 | 9/2004 | Suzuki | |
| 7,421,255 B2 * | 9/2008 | Inamori et al. | 455/127.2 |
| 7,532,680 B2 | 5/2009 | Vayrynen et al. | |
| 7,724,086 B2 | 5/2010 | Camuffo et al. | |
| 7,747,227 B2 * | 6/2010 | Fukuda | 455/91 |
| 7,805,116 B2 | 9/2010 | Xu et al. | |
| 7,974,596 B2 | 7/2011 | Lim et al. | |
| 7,977,947 B1 * | 7/2011 | Jones et al. | 324/522 |
| 7,991,367 B2 | 8/2011 | Pratt et al. | |
| 8,095,166 B2 | 1/2012 | Sampath et al. | |
| 8,249,531 B2 | 8/2012 | Xu et al. | |
| 2005/0227646 A1 * | 10/2005 | Yamazaki et al. | 455/127.3 |

(Continued)

OTHER PUBLICATIONS

3GPP TS 34.121 "Technical Specification Group Radio Access Network; Terminal Conformance Specification; Radio Transmission and Reception (FDD)", Release 6, version 6.4.0, Mar. 2006.

Lipshitz et al., U.S. Appl. No. 61/255,815 "Transmit Power Loop Selection in Systems with Open Loop/Closed Loop Power Setting" filed Oct. 28, 2009. 3GPP TS 25.101 "Technical Specification Group Radio Access Network; User Equipment (UE) Radio Transmission and Reception (FDD)", Release 8, version 8.51, Jan. 2009.

(Continued)

*Primary Examiner* — Junpeng Chen

(57) ABSTRACT

A transmitter includes a Power Amplifier (PA), an antenna, at least one passive component and control circuitry. The PA is controlled by a PA control voltage, is operative to amplify a Radio Frequency (RF) signal and has input and output amplifier terminals. The passive component has an input component terminal coupled to the output amplifier terminal of the PA and an output component terminal coupled to the antenna. The control circuitry is configured to determine an interim power level at the output amplifier terminal that causes the signal at the output component terminal to have a target output power level, to determine, based on the interim power level, a given PA control voltage that makes the interim power level producible by the PA, so that the signal at the output component terminal has the target output power level, and to apply the given PA control voltage to the PA.

24 Claims, 5 Drawing Sheets

(56) References Cited

U.S. PATENT DOCUMENTS

| | | |
|---|---|---|
| 2006/0240784 A1 | 10/2006 | Naguib et al. |
| 2006/0270367 A1* | 11/2006 | Burgener et al. .......... 455/127.1 |
| 2007/0243838 A1 | 10/2007 | Lang |
| 2007/0270174 A1* | 11/2007 | Heinonen et al. ............. 455/522 |
| 2008/0220806 A1 | 9/2008 | Shin et al. |
| 2009/0111399 A1 | 4/2009 | Norris et al. |
| 2009/0163155 A1 | 6/2009 | Camuffo et al. |
| 2010/0008410 A1 | 1/2010 | Shute et al. |
| 2010/0029226 A1* | 2/2010 | Visser ........................ 455/115.1 |
| 2010/0311474 A1 | 12/2010 | Donovan et al. |

OTHER PUBLICATIONS

Lipshitz et al., U.S. Appl. No. 61/303,539 "Transmit Power Loop Selection in Systems with Open Loop/Closed Loop Power Setting" filed Feb. 11, 2010.

Lipshitz et al., U.S. Appl. No. 12/771,212 "High-Accuracy Transmit Power Control With High-Efficiency Power Amplifier Operation", filed May 2, 2010.

U.S. Appl. No. 12/814,456 Ex Parte Quayle Action dated Sep. 24, 2012 (7 pages).

U.S. Appl. No. 13/587,231 Office action dated Nov. 28, 2012.

\* cited by examiner

SETTING OF POWER AMPLIFIER CONTROL VOLTAGE

CROSS-REFERENCE TO RELATED APPLICATIONS

This application claims the benefit of U.S. Provisional Patent Application 61/245,235, filed Sep. 23, 2009, and U.S. Provisional Patent Application 61/255,812, filed Oct. 28, 2009, whose disclosures are incorporated herein by reference. This application is related to a U.S. patent application entitled "High-Accuracy Transmit Power Control with High-Efficiency Power Amplifier Operation," Ser. No. 12/772,212, filed on even date, which is assigned to the assignee of the present patent application and whose disclosure is incorporated herein by reference

FIELD OF THE DISCLOSURE

The present disclosure relates generally to Radio Frequency (RF) transmitters, and particularly to methods and systems for controlling Power Amplifiers (PAs) in RF transmitters.

BACKGROUND

Various communication transmitters modify the power of transmitted signals, for example in order to adapt to current channel conditions. Such techniques are commonly referred to as transmit power control. For example, Technical Specification Group (TSG) RAN WG4 of the $3^{rd}$ Generation Partnership Project (3GPP) specifies the transmission and reception characteristics of Universal Mobile Telecommunications System (UMTS) User Equipment (UE) in a specification entitled "UE Radio Transmission and Reception (FDD)," TS 25.101, version 8.5.1, January, 2009, which is incorporated herein by reference. In particular, section 6.5 specifies the accuracy and timing requirements of output power setting in UMTS UEs. Conformance test procedures for verifying compliance of UMTS UEs with power control specifications are defined in a 3GPP Technical Specification entitled "Terminal Conformance Specification; Radio Transmission and Reception (FDD) (Release 6)," TS 34.121, version 6.4.0, March, 2006, which is incorporated herein by reference. UMTS compliant transmitters need to be compliant with these specifications.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

An embodiment that is described herein provides a transmitter, which includes a Power Amplifier (PA), an antenna, at least one passive component and control circuitry. The PA is controlled by a PA control voltage, is operative to amplify a Radio Frequency (RF) signal and has input and output amplifier terminals. The passive component has an input component terminal coupled to the output amplifier terminal of the PA and an output component terminal coupled to the antenna. The control circuitry is configured to determine an interim power level at the output amplifier terminal that causes the signal at the output component terminal to have a target output power level, to determine, based on the interim power level, a given PA control voltage that makes the interim power level producible by the PA, so that the signal at the output component terminal has the target output power level, and to apply the given PA control voltage to the PA.

In some embodiments, the transmitter includes a digital transmission chain, which provides the input amplifier terminal of the PA with the signal and has an adjustable gain, and the control circuitry is configured to cause the signal at the output amplifier terminal, while the given PA control voltage is applied to the PA, to have the interim power level. In an embodiment, the control circuitry is configured to measure the signal at the output amplifier terminal and to set the adjustable gain based on the signal measured at the output amplifier terminal.

In a disclosed embodiment, the control circuitry is configured to store calibration data that is indicative of insertion losses of the passive component at respective output power levels of the PA, to store characterization data that specifies pre-characterized PA control voltages at the respective output power levels of the PA, and to determine the interim power level and the given PA control voltage by querying the calibration data and the characterization data. In an embodiment, the calibration data and the characterization data apply to reference operating conditions, and the control circuitry is configured to calculate the interim power level and the given PA control voltage for actual operating conditions that are different from the reference operating conditions. In an embodiment, the control circuitry is configured to calculate the interim power level and the given PA control voltage for actual reference temperature, frequency and signal modulation that are different from respective reference temperature, frequency and signal modulation. In another embodiment, the control circuitry is configured to determine the interim power level responsively to a pre-characterized PA control voltage that is mapped to the target output power level in the characterization data.

In some embodiments, the control circuitry is configured to further adjust the given PA control voltage based on a modulation scheme used in modulating the signal. In an embodiment, the control circuitry is configured to determine the given PA control voltage based on the interim power level when the target output power level is in a first power range, and to determine the given PA control voltage based on an open-loop characterization when the target output power level is in a second power range, at least partially lower than the first power range. In another embodiment, the control circuitry is configured to set an input power level of the signal at the input amplifier terminal using a closed-loop mechanism when the target output power level is in a first power range, and is configured to set the input power level of the signal at the input amplifier terminal using an open-loop mechanism when the target output power level is in a second power range, at least partially lower than the first power range.

An additional embodiment provides a mobile communication terminal that includes the disclosed transmitter. Yet another embodiment provides a chipset for processing signals in a mobile communication terminal, including the disclosed transmitter.

There is additionally provided, in accordance with an embodiment that is described herein, a transmission method in a transmitter that includes a Power Amplifier (PA) that amplifies the signal and has input and output amplifier terminals, an antenna, and at least one passive component having an input component terminal coupled to the output amplifier terminal and an output component terminal coupled to the antenna. The method includes determining an interim power level at the output amplifier terminal that causes a Radio Frequency (RF) signal at the output component terminal to have a target output power level. Based on the interim power level, a PA control voltage that makes the interim power level producible by the PA is determined, so that the signal at the output component terminal has the target output power level. The determined PA control voltage is applied to the PA, the RF signal is amplified using the PA, and the amplified RF signal is transmitted.

The present disclosure will be more fully understood from the following detailed description of the embodiments thereof, taken together with the drawings in which:

DETAILED DESCRIPTION OF EMBODIMENTS

Figure 1:
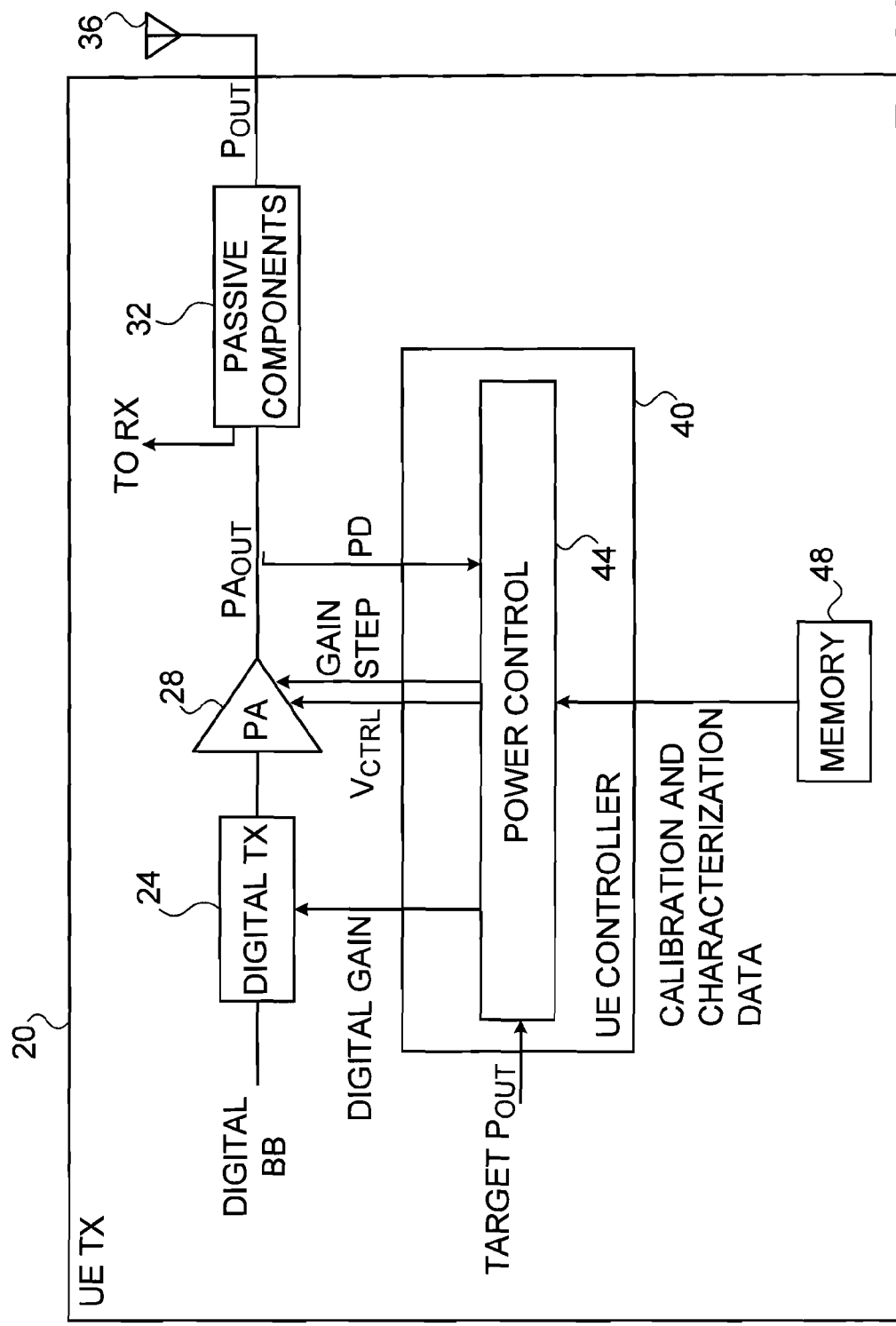
FIG. 1 is a block diagram that schematically illustrates a transmitter that uses power control, in accordance with an embodiment of the present disclosure.

Embodiments that are described herein provide improved methods and systems for controlling Radio Frequency (RF) transmitters. In some embodiments, a transmitter comprises a transmission chain that is coupled to a Power Amplifier (PA). The signal at the PA output passes through one or more passive components, such as for example a duplexer, and then is transmitted by an antenna. The gain of the transmission chain is adjustable by setting a digital gain value, the gain of the PA is adjustable by setting a PA gain step control and the PA efficiency is controlled by adjusting a PA control voltage. In an embodiment, the transmitter comprises control circuitry, which enables controlling the signal power at the PA output in a closed loop. Typically, the closed-loop mechanism measures the signal power at the PA output, and adjusts the digital gain until the signal power at the PA output reaches the desired output power level.

In some embodiments, the control circuitry accepts a target output power level, which the signal is requested to have at the transmitter output (i.e., at the antenna, after the passive components). The control circuitry first determines the PA output power level that would produce the target output power level at the transmitter output. (The PA output power differs from the transmitter output power, for example because of losses in the passive components.) In an embodiment, the control circuitry determines the power level at the PA output by querying calibration data, which is indicative of the insertion loss of the passive components. Having determined the desired PA output power level, e.g., the PA output power level that achieves the target output power level at the transmitter output, the above-mentioned closed-loop mechanism adjusts the digital gain of the transmission chain so as to maintain the PA output power at that level.

In accordance with an embodiment, the control circuitry then determines a PA control voltage that is (1) sufficiently high to allow the PA to produce the signal at the desired power level and at an acceptable signal fidelity, and (2) sufficiently low to achieve high PA efficiency. In an embodiment, the control circuitry determines the PA control voltage by querying characterization data, which comprises pre-characterized PA control voltages at respective output power levels. The control circuitry applies the determined PA control voltage to the PA. Although changes in PA control voltage may vary the PA gain, this gain variation is automatically corrected, e.g. by the closed-loop mechanism, so that a change to the PA control voltage has no net effect on the PA output power level.

Typically, the calibration and characterization data are produced at certain reference operating conditions, e.g., reference frequency, temperature and signal modulation. In some embodiments, the control circuitry corrects the PA output power and PA control voltage to match the actual operating conditions of the transmitter. Example correction methods are described herein.

In the embodiments described herein, the PA control voltage is determined based on the actual PA output power level, measured directly at the PA output and before the passive components, rather than based on the transmitter output power. As such, the choice of PA control voltage is unaffected by possible variations in the passive components' insertion loss. The PA is therefore operated at high efficiency, while meeting the output power level and signal fidelity requirements.

FIG. 1 is a block diagram that schematically illustrates a transmitter 20 that uses power control, in accordance with an embodiment of the present disclosure. In the example of FIG. 1, transmitter 20 is embodied in a mobile communication terminal (also referred to as a User Equipment—UE) that transmits uplink signals to a Base Station (BS) in accordance with the Universal Mobile Telecommunications System (UMTS) specifications. In alternative embodiments, transmitter 20 may operate in accordance with any other suitable communication standard or protocol that involve setting of transmit power level. Although the embodiments described herein refer to uplink transmission, the disclosed techniques can be used in downlink transmission, as well.

Transmitter 20 comprises a transmission chain, depicted in the embodiment of FIG. 1 as a digital TX 24, which accepts a digital baseband input signal, and processes the signal to produce a modulated, low-power Radio Frequency (RF) signal. Transmission chain 24 typically amplifies, filters and up-converts the input signal. The gain that transmission chain 24 applies to the signal is programmable. In an embodiment, transmission chain 24 accepts a digital value, referred to herein as a digital gain, which sets the gain to be applied to the input signal.

The low-power RF signal produced by transmission chain 24 is amplified by a Power Amplifier (PA) 28. PA 28 has an input terminal for accepting the low-power RF signal from transmission chain 24, and an output terminal for outputting the amplified RF signal. The power of the RF signal at the output of PA 28 is denoted $PA_{OUT}$. The gain of PA 28 is controlled by a PA gain step control, which determines the discrete gain step of the PA. The power consumption efficiency of PA 28 is controlled by a PA control voltage denoted $V_{CTRL}$. In some embodiments, $V_{CTRL}$ denotes the supply voltage ($V_{CC}$) that powers the PA. In alternative embodiments, $V_{CTRL}$ comprises a bias voltage that biases one or more of the PA devices.

In an embodiment, the efficiency of PA 28, i.e., the power consumption of the PA for a given $PA_{OUT}$, can be controlled by varying $V_{CTRL}$. For a given $PA_{OUT}$, lower $V_{CTRL}$ values typically correspond to higher efficiency, and vice versa. On the other hand, lowering $V_{CTRL}$ may also limit the output power that can be achieved by the PA. For a certain desired $PA_{OUT}$, $V_{CTRL}$ can be reduced and the PA efficiency can be increased accordingly, up to a limit at which the PA is no longer able to produce the RF signal at the desired output power $PA_{OUT}$ and at a specified signal fidelity.

The RF signal produced by PA 28 is provided to one or more passive components 32, in the present example comprising a duplexer that filters the signal. The signal is then transmitted toward a base station (BS) (not seen in FIG. 1) using an antenna 36. In the present embodiment, antenna 36 is also used for receiving downlink signals from the BS. The downlink signals are filtered by the duplexer and provided to a downlink receiver (not seen in FIG. 1). The passive components thus have a transmitter input terminal that is connected to the output terminal of PA 28, a receiver output terminal that is connected to the receiver, and an antenna terminal that is connected to antenna 36. Additionally or alternatively to using a duplexer, passive components 32 may comprise any other suitable passive component that is connected between the PA and the antenna, such as filters, matching networks, switches or circulators.

Transmitter 20 comprises a controller 40, which manages the transmitter operation and controls the different transmitter elements. In particular, controller 40 configures TX chain 24 with the appropriate digital gain, PA 28 with the appropriate PA gain step and PA 28 with the appropriate $V_{CTRL}$, so as to cause the transmitter to transmit uplink signals at the desired output power and to operate at high efficiency.

In some embodiments, controller 40 comprises a power control module 44, which carries out the methods described herein. Module 44 accepts a measurement of the PA output power $PA_{OUT}$. The measured $PA_{OUT}$ value reported to module 44 is denoted "Power Detected" (PD). The transmitter may produce PD, for example, using a coupler and power detector that sense the signal at the output of PA 28. Additionally, module 44 accepts a requested target value of the output power level $P_{OUT}$. In the embodiments described herein, the term "output power level" ($P_{OUT}$) refers to the signal power at the output of passive components 32, i.e., at the input of antenna 36. In alternative embodiments, however, $P_{OUT}$ may denote the power of the signal transmitted by antenna 36, which can be sensed using any suitable means.

In an embodiment, transmitter 20 comprises a memory 48, which holds calibration and characterization data that is used by module 44 in setting the digital gain, the PA gain step and $V_{CTRL}$. Module 44 calculates and sets the digital gain, the PA gain step and $V_{CTRL}$ based on the above-described inputs using methods that are explained in detail below.

In some practical cases, changes in $V_{CTRL}$ affect the gain of PA 28. In some embodiments, module 44 in controller 40 applies a closed-loop control mechanism that maintains the PA output power ($PA_{OUT}$) at a desired level despite changes to $V_{CTRL}$. Typically, the closed-loop mechanism accepts a certain target value of PD, measures the actual PD (which is indicative of the actual $PA_{OUT}$), and adjusts the digital gain of transmission chain 24 so as to cause the actual PD to approach the target PD. When using this closed-loop mechanism, $PA_{OUT}$ is unaffected by the PA gain. In particular, $PA_{OUT}$ is unaffected by the choice of $V_{CTRL}$.

The transmitter configuration shown in FIG. 1 is a simplified example configuration, which is depicted for the sake of conceptual clarity. In alternative embodiments, any other suitable transmitter configuration can also be used. The different components of transmitter 20 may be implemented using dedicated hardware, such as using one or more Application-Specific Integrated Circuits (ASICs) and/or Field-Programmable Gate Arrays (FPGAs). Alternatively, some transmitter components may be implemented using software instructions that run on general-purpose hardware, or using a combination of dedicated hardware and software instructions that run on general purpose hardware. Controller 40, memory 48 and the power detector in transmitter 20 are referred to herein collectively as control circuitry, which is configured to carry out the methods described herein.

Typically, controller 40 comprises a general-purpose processor, which is programmed using software instructions that are stored in a memory, such as memory 48 or other suitable memory device, to carry out the functions described herein, although it too may be implemented on dedicated hardware. The software instructions may be downloaded to the processor in electronic form, over a network, for example, or it may, alternatively or additionally, be provided and/or stored on non-transitory tangible media, such as magnetic, optical, or electronic memory. In some embodiments, some or all of the elements of transmitter 20 may be fabricated in a chip-set. Transmitter elements that are not mandatory for explanation of the disclosed techniques have been omitted from FIG. 1 for the sake of clarity and to avoid obfuscating the teachings of this disclosure.

In some embodiments, transmitter 20 is requested by the BS to transmit at a certain output power level $P_{OUT}$. For example, in UMTS systems the BS sends to the UE Transmit Power Control (TPC) commands over a downlink channel. The TPC commands request the UE transmitter to increase or decrease its output power by a specified step (e.g., 1 dB or 2 dB). In response to the TPC commands, module 44 in controller 40 adjusts $P_{OUT}$ by modifying the digital gain and/or PA gain step and/or $V_{CTRL}$. The UMTS specifications specify the absolute and relative accuracies in setting $P_{OUT}$, and the power adjustments made by module 44 should typically meet these specifications. At the same time, it is typically desirable to operate PA 28 at the highest possible efficiency that still enables the transmitter to transmit at the target $P_{OUT}$ and at the specified signal fidelity, so as to reduce the transmitter power consumption.

Figure 2:
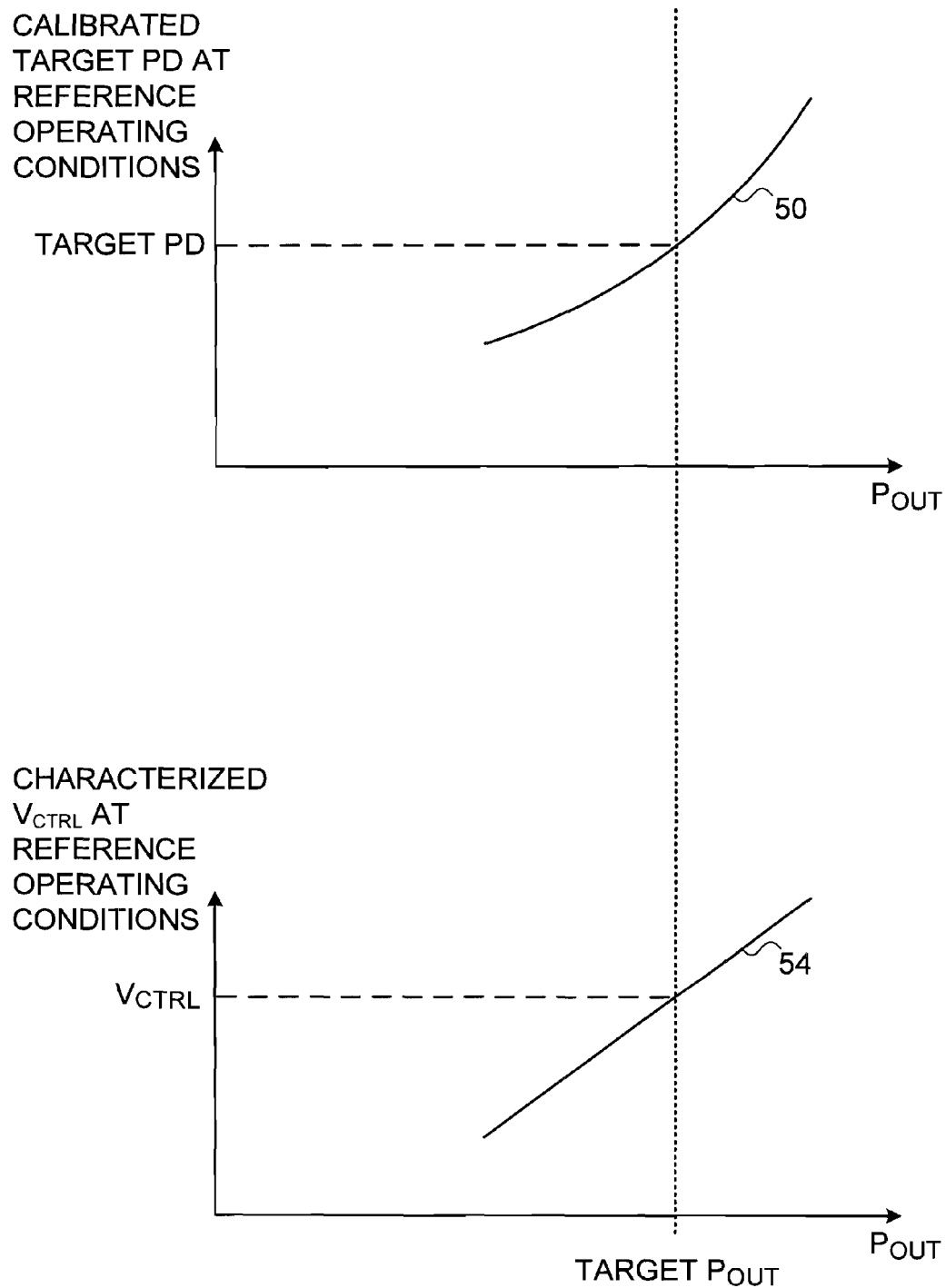
FIG. 2 is a graph showing calibration and characterization data for transmit power control, in accordance with an embodiment of the present disclosure.

FIG. 2 is a graph showing example calibration and characterization data that are stored in memory 48 for a given PA gain step setting, in accordance with an embodiment of the present disclosure. The top graph in FIG. 2 shows calibration data 50, which comprise target PD values at respective $P_{OUT}$ values. Each [$P_{OUT}$,PD] data point in calibration data 50 gives the PD value that would cause transmitter 20 to produce a signal at the respective output power level $P_{OUT}$. Thus, calibration data is indicative of the insertion loss of passive components 32 as a function of signal power.

Typically, calibration data 50 is pre-measured and stored for each individual transmitter 20 at reference operating conditions (e.g., reference frequency and temperature). Calibration data 50 is typically available over a range of power levels at which the power detector that measures PD produces reliable measurements. In an example embodiment, calibration data 50 covers a specified power range at 1 dB increments, although any other suitable resolution can also be used.

The bottom graph in FIG. 2 shows characterization data 54, which comprise $V_{CTRL}$ values at respective $P_{OUT}$ values. Each [$P_{OUT}$,$V_{CTRL}$] data point in characterization data 54 gives a $V_{CTRL}$ value that is (1) sufficiently high to enable the PA to produce the signal at the respective $P_{OUT}$ at an acceptable signal fidelity, and (2) sufficiently low to achieve high PA efficiency.

Typically, characterization data 54 is pre-characterized over a group (e.g., type or production batch) of transmitters 20 at reference operating conditions (e.g., reference frequency, temperature and signal modulation). In an example embodiment, characterization data 54 covers a specified power range at 1 dB increments, although any other suitable resolution can also be used.

In an example embodiment, module 44 in controller 40 accepts a target $P_{OUT}$ that should be met by transmitter 20. Module 44 obtains a target PD that corresponds to the target $P_{OUT}$ by querying calibration data 50 (see top graph in FIG. 2). Module 44 also obtains a $V_{CTRL}$ value that corresponds to the target $P_{OUT}$ by querying characterization data 54 (see bottom graph in FIG. 2). Module 44 applies this $V_{CTRL}$ to PA 28, and sets the PA output power $PA_{OUT}$ to match the target PD using the closed-loop mechanism. At these settings, transmitter 20 transmits the signal at the desired output power level (target $P_{OUT}$), while meeting the signal fidelity requirements and while operating the PA at high efficiency.

In some practical cases, the optimal values for $V_{CTRL}$ and the target PD may differ from the values given in calibration data 50 and characterization data 54. Such differences may occur, for example, when the actual operating conditions of the transmitter differ from the reference operating conditions at which the calibration and characterization data were produced. Methods for correcting $V_{CTRL}$ and the target PD to account for the actual transmitter operating conditions are described further below.

Figure 3:
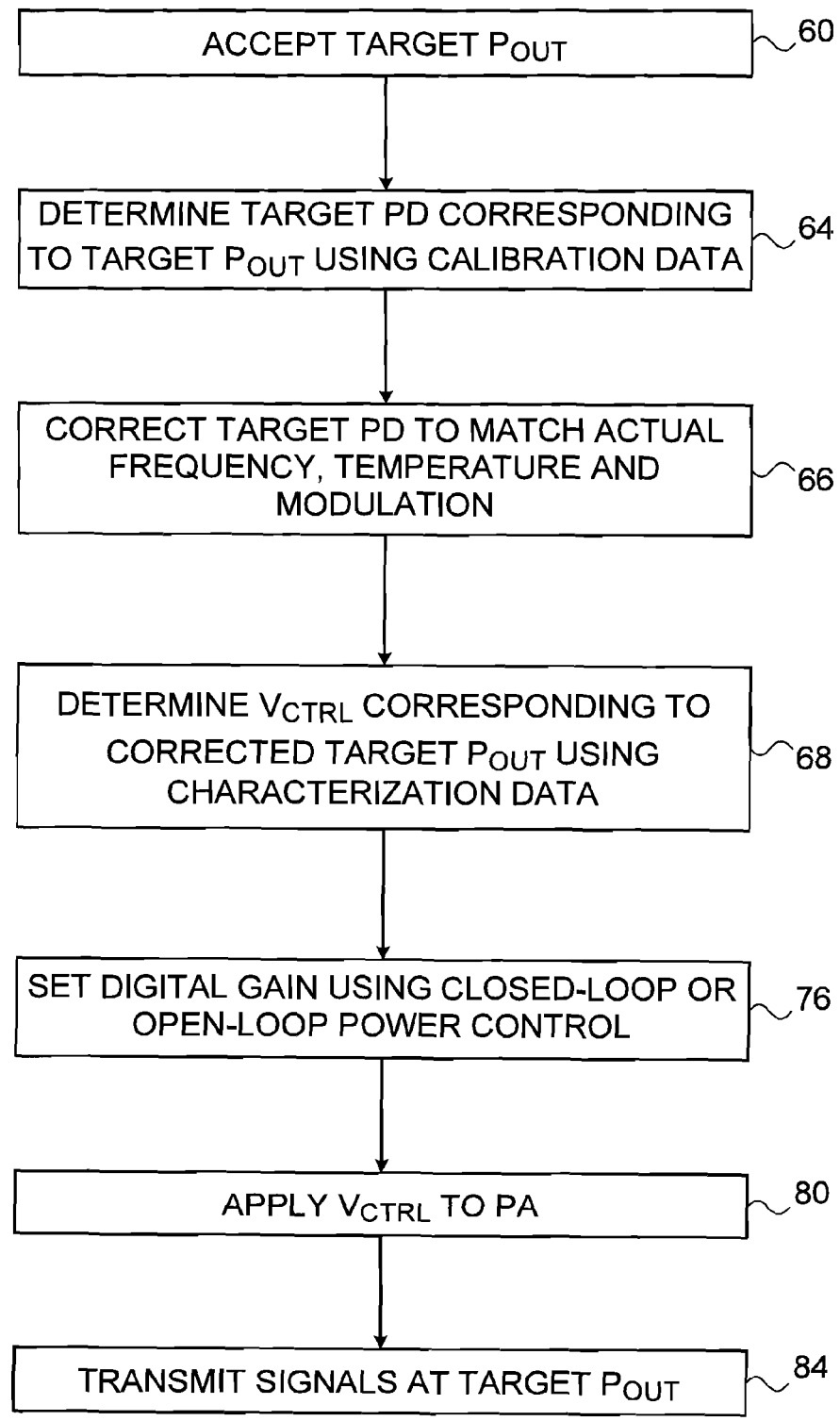
FIG. 3 is a flow chart that schematically illustrates a method for transmit power control, in accordance with an embodiment of the present disclosure.

FIG. 3 is a flow chart that schematically illustrates a method for transmit power control, in accordance with an embodiment of the present disclosure. The method begins at an input operation 60, with module 44 in controller 40 accepting a target $P_{OUT}$ value that is to be met by transmitter 20. At a target PD selection operation 64, module 44 determines the target PD that corresponds to the requested target $P_{OUT}$ value. Typically, module 44 determines the target PD by querying calibration data 50.

In an embodiment, at a correction operation 66, module 44 corrects the target PD value, to account for the actual operating conditions (e.g., frequency, temperature and signal modulation) of the transmitter. At a $V_{CTRL}$ selection operation 68, module 44 determines the $V_{CTRL}$ that corresponds to the corrected target PD value. Typically, module 44 determines $V_{CTRL}$ by querying characterization data 54. Example correction schemes for $V_{CTRL}$ are shown in FIGS. 4 and 5 below.

At a loop setting operation 76, module 44 determines the selected loop mechanism. If the open-loop mechanism is selected then module 44 applies a digital gain value based on the $V_{CTRL}$ as described in the U.S. patent application entitled "High-Accuracy Transmit Power Control with High-Efficiency Power Amplifier Operation," Ser. No. 12/772,212, cited above. If the closed-loop mechanism is selected then module 44 uses the target PD value that was determined at operation 64 above, and corrected at operation 72 above. At a $V_{CTRL}$ setting operation 80, module 44 applies the $V_{CTRL}$ value to PA 28. The $V_{CTRL}$ value used at this stage is the value that was determined at operation 68 above, and corrected at operation 72 above.

At a transmission operation 84, transmitter 20 transmits the signal at the target output power requested at operation 60 above. Because of the above-described selection of $V_{CTRL}$, PA 28 operates at high efficiency, while meeting the output power level and signal fidelity requirements.

Figure 4:
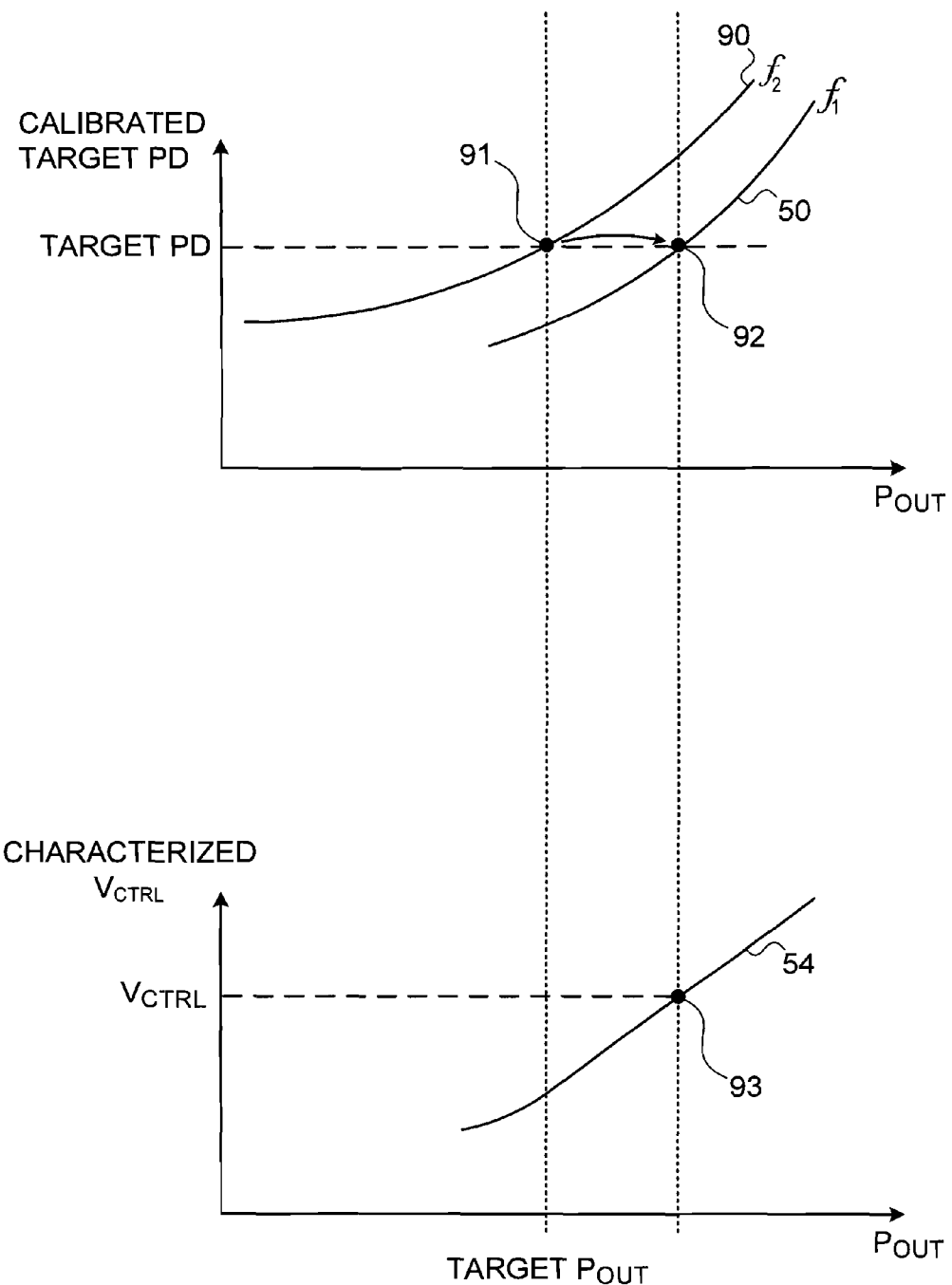
FIGS. 4 and 5 are graphs schematically showing processes for determining a Power Amplifier (PA) control voltage during transmit power control, in accordance with embodiments of the present disclosure.
Figure 5:
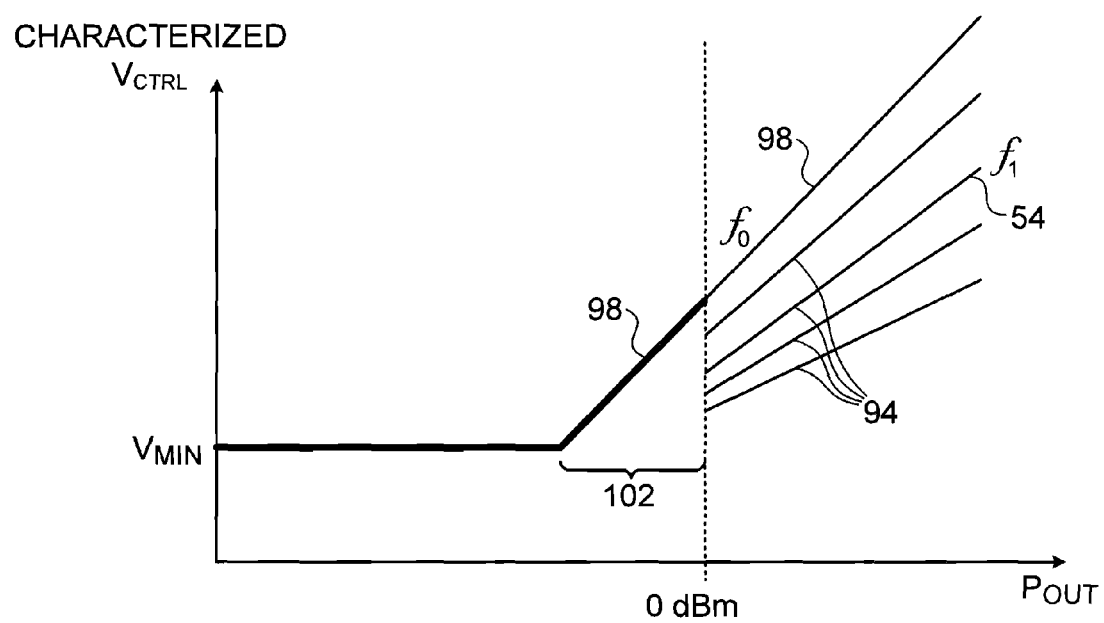

FIG. 4 is a graph showing a process for correcting $V_{CTRL}$ to account for the actual operating frequency of the transmitter, in accordance with an embodiment of the present disclosure. In the present example, calibration data 50 and characterization data 54 were produced at a reference signal frequency denoted $f_1$. At a certain point in time, however, the transmitter transmits signals at a frequency $f_2$ that is different from $f_1$. Assume also that the variation of the target PD as a function of frequency is known.

In this scenario, a data point 91 marks the target PD corresponding to the target $P_{OUT}$ at frequency $f_2$. The $V_{CTRL}$ value that is best suited for the target PD at frequency $f_2$ is unknown, however, since characterization data 54 was produced at frequency $f_1$. In an embodiment, module 44 determines a data point 92 in calibration data 50, which corresponds to the same target PD as data point 91. Then, module 54 determines a $V_{CTRL}$ value 93 in characterization data 54, which corresponds to data point 92. Module 44 applies $V_{CTRL}$ value 93 to PA 28, and uses it for transmission at frequency $f_2$.

In some embodiments, the closed-loop mechanism operates over only part of the transmitter output power range, e.g., because the power detector that measures PD has limited sensitivity. At low output power levels, module 44 sets the digital gain using an open-loop mechanism, e.g., based on a pre-calibrated mapping of digital gain to output power that is stored in memory 48. Typically, some overlap exists between the output power ranges of the open-loop and closed-loop mechanisms. In the overlap region, any of the loops can be used.

When transmitter 20 operates using the open-loop mechanism in the overlap region, module 44 may determine the $V_{CTRL}$ and digital gain values in various ways. In an example embodiment, module 44 queries calibration data 50 (which is valid throughout the overlap region), and obtains the target PD that corresponds to the requested target $P_{OUT}$. Module 44 then finds the $V_{CTRL}$ corresponding to this target PD value, as explained above. From the $V_{CTRL}$ value, module 44 determines the digital gain value to be applied to transmission chain 24. An example method for finding the digital gain value based on $V_{CTRL}$ is described in the U.S. patent application entitled "High-Accuracy Transmit Power Control with High-Efficiency Power Amplifier Operation," Ser. No. 12/772,212, cited above. Alternatively, any other suitable method can be used.

When operating at low $P_{OUT}$ levels where no PD calibration data is available, module 44 sets $V_{CTRL}$ as a function of $P_{OUT}$ according to a certain worst-case relation over all operating frequencies. In an embodiment, this worst-case relation is determined by characterization over multiple transmitters 20.

FIG. 5 is a graph showing a process for determining $V_{CTRL}$ as a function of $P_{OUT}$, in accordance with an embodiment of the present disclosure. In the present example, the calibrated target PD value for all operational frequencies is available for $P_{OUT} \geq 0$ dBm.

In an embodiment, below 0 dBm, module 44 sets $V_{CTRL}$ as a function of $P_{OUT}$ according to a worst-case curve 98. This worst-case relation is typically determined by characterization. For very low output power levels, $V_{CTRL}$ is set constantly to a certain minimum value $V_{MIN}$. Above a certain output power level, $V_{CTRL}$ begins to increase with output power. This section corresponds to a certain worst-case frequency $f_0$.

Above 0 dBm, module 44 sets $V_{CTRL}$ as a function of $P_{OUT}$ according to calibration data 54, as explained above. Calibration data 54 was obtained at a reference frequency $f_1$. For other operating frequencies, the dependence of $V_{CTRL}$ on of $P_{OUT}$ is shown by graphs 94.

Consider a region 102 in FIG. 5, in which the worst-case characterized $V_{CTRL}$ value increases as a function of $P_{OUT}$. In some embodiments, module 44 may reduce the $V_{CTRL}$ values in this region below the worst-case value, to $V_{CTRL}$ suited for 0 dBm as seen on graphs 54 or 94 (depending on the operating frequency) or to any other suitable value. This reduction in $V_{CTRL}$ increases the PA efficiency for $P_{OUT}$ levels in region 102.

In some embodiments, characterization data 54 is measured for a certain reference modulation scheme. The actual modulation scheme used by transmitter 20 at a given time may differ from the reference modulation scheme for which the characterization data was obtained. In some embodiments, module 44 corrects the $V_{CTRL}$ value to account for the difference between the actual and reference modulation scheme. In an example embodiment, the actual and reference modulation schemes have respective, different Cubic Metrics (CM). Module 44 corrects $V_{CTRL}$ by a correction factor that depends on the difference (or ratio) between the CMs of the actual and reference modulation schemes. This sort of correction can be determined, for example, by characterization over multiple transmitters.

The correction schemes shown in FIGS. 4 and 5 above are example schemes, which are depicted purely for the sake of conceptual clarity. In alternative embodiments, module 44 may correct the $V_{CTRL}$ value in any other suitable way to account for the actual operating conditions of the transmitter (for example the combined affect of the operating frequency and temperature). In some embodiments, module 44 takes into consideration additional factors when correcting $V_{CTRL}$, such as the matching between the transmitter and the antenna (e.g., the Voltage Standing Wave Ratio—VSWR) or various loop errors in the closed-loop and open-loop mechanisms.

It is noted that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art.

The invention claimed is:

1. A transmitter, comprising:
    a Power Amplifier (PA), which is controlled by a PA control voltage and which is operative to amplify a Radio Frequency (RF) signal and has input and output amplifier terminals;
    an antenna;
    at least one passive component, which has an input component terminal coupled to the output amplifier terminal of the PA and an output component terminal coupled to the antenna, and which has a variable insertion loss that varies depending on an operating condition of the signal passing the at least one passive component;
    a memory, which is configured to store pre-measured calibration data that is indicative of the insertion loss of the at least one passive component as a function of the operating condition; and
    control circuitry, which is configured to assess the variable insertion loss of the at least one passive component at a target output power level by querying the calibration data stored in the memory, to determine, based on the assessed variable insertion loss, an interim power level at the output amplifier terminal that causes the signal at the output component terminal to have the target output power level, to determine, based on the interim power level at the output amplifier terminal, a given PA control voltage that makes the interim power level producible by the PA, so that the signal at the output component terminal has the target output power level, and to apply the given PA control voltage to the PA.

2. The transmitter according to claim 1, and comprising a digital transmission chain, which provides the input amplifier terminal of the PA with the signal and has an adjustable gain, wherein the control circuitry is configured to cause the signal at the output amplifier terminal, while the given PA control voltage is applied to the PA, to have the interim power level.

3. The transmitter according to claim 2, wherein the control circuitry is configured to measure the signal at the output amplifier terminal and to set the adjustable gain based on the signal measured at the output amplifier terminal.

4. The transmitter according to claim 1, wherein the control circuitry is configured to store the calibration data in the memory, to store in the memory characterization data that specifies pre-characterized PA control voltages as a function of the operating condition, and to determine the interim power level and the given PA control voltage by querying the calibration data and the characterization data.

5. The transmitter according to claim 4, wherein the calibration data and the characterization data apply to reference operating conditions, and wherein the control circuitry is configured to calculate the interim power level and the given PA control voltage for actual operating conditions that are different from the reference operating conditions.

6. The transmitter according to claim 5, wherein the control circuitry is configured to calculate the interim power level and the given PA control voltage for actual reference temperature, frequency and signal modulation that are different from respective reference temperature, frequency and signal modulation.

7. The transmitter according to claim 4, wherein the control circuitry is configured to determine the interim power level responsively to a pre-characterized PA control voltage that is mapped to the target output power level in the characterization data.

8. The transmitter according to claim 1, wherein the control circuitry is configured to further adjust the given PA control voltage based on a modulation scheme used in modulating the signal.

9. The transmitter according to claim 1, wherein the control circuitry is configured to determine the given PA control voltage based on the interim power level when the target output power level is in a first power range, and to determine the given PA control voltage based on an open-loop characterization when the target output power level is in a second power range, at least partially lower than the first power range.

10. The transmitter according to claim 1, wherein the control circuitry is configured to set an input power level of the signal at the input amplifier terminal using a closed-loop mechanism when the target output power level is in a first power range, and is configured to set the input power level of the signal at the input amplifier terminal using an open-loop mechanism when the target output power level is in a second power range, at least partially lower than the first power range.

11. A mobile communication terminal comprising the transmitter of claim 1.

12. A chipset for processing signals in a mobile communication terminal, comprising the transmitter of claim 1.

13. A transmission method, comprising:
    in a transmitter that includes a Power Amplifier (PA) that amplifies the signal and has input and output amplifier terminals, an antenna, and at least one passive component that has an input component terminal coupled to the output amplifier terminal and an output component terminal coupled to the antenna and that has a variable insertion loss that varies depending on an operating condition of the signal passing the at least one passive component, storing in a memory pre-measured calibration data that is indicative of the insertion loss of the at least one passive component as a function of the operating condition;

assessing the variable insertion loss of the at least one passive component at a target output power level by querying the calibration data stored in the memory;

determining, based on the assessed variable insertion loss, an interim power level at the output amplifier terminal that causes a Radio Frequency (RF) signal at the output component terminal to have the target output power level;

determining, based on the interim power level, a PA control voltage that makes the interim power level producible by the PA, so that the signal at the output component terminal has the target output power level;

applying the determined PA control voltage to the PA; and amplifying the RF signal using the PA, and transmitting the amplified RF signal.

14. The method according to claim 13, comprising adjusting a gain of a digital transmission chain that provides the input amplifier terminal of the PA with the signal, so to cause the signal at the output amplifier terminal, while the given PA control voltage is applied to the PA, to have the interim power level.

15. The method according to claim 13, comprising storing in the memory characterization data that specifies pre-characterized PA control voltages as a function of the operating condition, and determining the interim power level and the PA control voltage by querying the calibration data and the characterization data.

16. The method according to claim 15, wherein the calibration data and the characterization data apply to reference operating conditions, and wherein determining the interim power level and the PA control voltage comprise calculating the interim power level and the PA control voltage for actual operating conditions that are different from the reference operating conditions.

17. The method according to claim 16, wherein determining the interim power level and the PA control voltage comprise calculating the interim power level and the PA control voltage for actual reference temperature, frequency and signal modulation that are different from respective reference temperature, frequency and signal modulation.

18. The method according to claim 15, wherein determining the interim power level comprises calculating the interim power level responsively to a pre-characterized PA control voltage that is mapped to the target output power level in the characterization data.

19. The method according to claim 13, comprising adjusting the PA control voltage based on a modulation scheme used in modulating the signal.

20. The method according to claim 13, wherein determining the PA control voltage comprises setting the PA control voltage based on the interim power level when the target output power level is in a first power range, and setting the PA control voltage based on open-loop characterization when the target output power level is in a second power range, at least partially lower than the first power range.

21. The transmitter according to claim 1, wherein the operating condition comprises a frequency of the signal.

22. The transmitter according to claim 1, wherein the operating condition comprises a power level of the signal.

23. The method according to claim 13, wherein the operating condition comprises a frequency of the signal.

24. The method according to claim 13, wherein the operating condition comprises a power level of the signal.

\* \* \* \* \*